United States Patent
Brown et al.

(10) Patent No.: US 10,838,837 B2
(45) Date of Patent: Nov. 17, 2020

(54) SENSOR BASED SYSTEM STATE PREDICTION

(71) Applicant: INTERNATIONAL BUSINESS MACHINES CORPORATION, Armonk, NY (US)

(72) Inventors: Michael Sean Brown, Wahroonga (AU); Sean R. Costello, St. Leonards (AU); Stefan Harrer, Hampton (AU); Laurence J. Plant, North Balwyn (AU)

(73) Assignee: International Business Machines Corporation, Armonk, NY (US)

( * ) Notice: Subject to any disclaimer, the term of this patent is extended or adjusted under 35 U.S.C. 154(b) by 843 days.

(21) Appl. No.: 15/192,036

(22) Filed: Jun. 24, 2016

(65) Prior Publication Data
US 2017/0372205 A1 Dec. 28, 2017

(51) Int. Cl.
*G06F 11/30* (2006.01)
*G06F 11/07* (2006.01)
(Continued)

(52) U.S. Cl.
CPC ...... *G06F 11/3013* (2013.01); *G06F 11/0739* (2013.01); *G06F 30/00* (2020.01);
(Continued)

(58) Field of Classification Search
CPC ............ G06T 7/00; G06T 2207/10032; G06T 2207/30232; G06F 9/00; G06F 9/30;
(Continued)

(56) References Cited

U.S. PATENT DOCUMENTS 6,748,325 B1 * 6/2004 Fujisaki ............... G01C 21/00
701/301
7,289,857 B2 10/2007 Nauck et al.
(Continued)

OTHER PUBLICATIONS

Valdivia et al., "A Coastal Distributed Autonomous Sensor Network" 2011 Singapore-MIT Alliance for Research and Technology, Center for Environmental Sensing and Modeling (Year: 2011).*
(Continued)

*Primary Examiner* — Miranda M Huang
*Assistant Examiner* — Chase P. Hinckley
(74) *Attorney, Agent, or Firm* — Schmeiser, Olsen & Watts; Nicholas L. Cadmus

(57) ABSTRACT

A method and system for predicting system states is provided. The method includes receiving a first reference model associated with a first operational attribute of a system from a first integrated circuit internally comprising a first processing circuit and a first sensor measuring a first parameter of the system. Additionally, a second reference model associated with a second operational attribute of the system is received from a second integrated circuit internally comprising a second processing circuit and a second sensor measuring a second parameter of the system. A combination reference model based on the first reference model and the second reference model is generated and a predicted future state and associated operational attributes for the system are determined based on the combination reference model.

24 Claims, 4 Drawing Sheets

(51) Int. Cl.
    *G06T 7/00*            (2017.01)
    *G06N 3/04*           (2006.01)
    *G06F 30/00*          (2020.01)

(52) U.S. Cl.
    CPC .............. *G06N 3/04* (2013.01); *G06T 7/00* (2013.01); *G06T 2207/10032* (2013.01); *G06T 2207/30232* (2013.01)

(58) Field of Classification Search
    CPC .. G06F 8/35; G06F 13/00; G06N 3/04; G06N 5/04; G06N 99/005
    USPC .......................................................... 706/12
    See application file for complete search history.

(56) References Cited

U.S. PATENT DOCUMENTS

| | | | |
|---|---|---|---|
| 7,813,870 B2 | 10/2010 | Downs et al. | |
| 7,917,333 B2* | 3/2011 | Grichnik | G05B 17/02 123/486 |
| 7,979,172 B2* | 7/2011 | Breed | G08G 1/161 701/117 |
| 8,489,317 B2 | 7/2013 | Caveney et al. | |
| 8,744,813 B2* | 6/2014 | Lacaille | G05B 23/0254 702/183 |
| 9,079,505 B1* | 7/2015 | Hyde | G06Q 10/0631 |
| 2002/0038199 A1* | 3/2002 | Blemel | F17D 5/02 702/183 |
| 2006/0025897 A1* | 2/2006 | Shostak | B60C 23/005 701/1 |
| 2006/0074557 A1* | 4/2006 | Mulligan | G05D 1/0094 701/13 |
| 2011/0141288 A1* | 6/2011 | Huang | G06K 9/00771 348/169 |
| 2011/0208496 A1* | 8/2011 | Bando | G01S 19/49 703/2 |
| 2012/0067268 A1* | 3/2012 | Guerrero | G01V 3/12 114/321 |
| 2012/0221193 A1* | 8/2012 | Delaye | G05B 23/0283 701/31.9 |
| 2012/0296567 A1* | 11/2012 | Breed | G01C 21/26 701/468 |
| 2013/0213482 A1* | 8/2013 | Schuberth | F17D 5/06 137/2 |
| 2014/0024999 A1* | 1/2014 | Levien | G05D 1/00 604/66 |
| 2014/0115146 A1 | 4/2014 | Johnson et al. | |
| 2015/0026044 A1* | 1/2015 | Refaeli | H04L 67/12 705/39 |
| 2015/0112545 A1* | 4/2015 | Binion | B60R 21/00 701/33.4 |
| 2015/0115994 A1* | 4/2015 | Graas | G01R 31/2856 324/762.05 |
| 2015/0181678 A1* | 6/2015 | Sachs | H05B 37/0218 315/152 |
| 2015/0226575 A1* | 8/2015 | Rambo | B64C 39/024 701/523 |
| 2015/0254555 A1* | 9/2015 | Williams, Jr. | G06N 3/0454 706/14 |
| 2015/0274315 A1* | 10/2015 | Conrad | B64D 45/00 701/31.9 |
| 2015/0339586 A1* | 11/2015 | Adjaoute | G06N 3/08 706/52 |
| 2016/0133066 A1* | 5/2016 | Lavie | G07C 5/08 701/31.4 |
| 2016/0142160 A1* | 5/2016 | Walker | H04W 4/70 702/104 |
| 2016/0163133 A1* | 6/2016 | Ricci | H04W 4/21 701/33.4 |
| 2016/0196750 A1* | 7/2016 | Collins | B64C 39/024 701/14 |
| 2016/0259873 A1* | 9/2016 | Kessie | G06F 30/23 |
| 2016/0350671 A1* | 12/2016 | Morris, II | G05B 23/0229 |
| 2016/0352764 A1* | 12/2016 | Mermoud | H04L 63/1425 |
| 2016/0357188 A1* | 12/2016 | Ansari | G05D 1/0212 |
| 2017/0026893 A1* | 1/2017 | Lagassey | G07C 5/008 |
| 2017/0123421 A1* | 5/2017 | Kentley | G01S 17/87 |
| 2017/0166328 A1* | 6/2017 | Ethington | G06Q 10/06311 |
| 2017/0279828 A1* | 9/2017 | Savalle | H04L 63/1416 |
| 2017/0293542 A1* | 10/2017 | Xu | G06N 3/084 |
| 2017/0364818 A1* | 12/2017 | Wu | G06N 20/00 |
| 2018/0136995 A1* | 5/2018 | Sheppard | G06F 11/0709 |
| 2018/0136996 A1* | 5/2018 | Jung | G06F 11/0727 |

OTHER PUBLICATIONS

Chen et al., "A Sharable and Interoperable Meta-Model for Atmospheric Satellite Sensors and Observations" Oct. 2012 IEEE Journal of Selected Topics in Applied Earth Observations and Remote Sensing, vol. 5 No. 5 (Year: 2012).*
McConnell et al., "A Distributed Approach for Prediction in Sensor Networks" 2005 Queens University. (Year: 2005).*
Sun et al., "Parameter Estimation for Towed Cable Systems Using Moving Horizon Estimation" Sep. 30, 2014 IEEE Transactions on Aerospace and Electronic Systems, vol. 51, No. 2, pp. 1432-1446. (Year: 2014).*
Vanini et al., "Fault detection and isolation of a dual spool gas turbine engine using dynamic neural networks and multiple model approach" Jun. 4, 2013, Information Sciences, pp. 234-251. (Year: 2013).*
Reed et al., "Controller Design for Underwater Vehicle Systems with Communication Constraints" Feb. 2015, pp. 1-201. (Year: 2015).*
Sarkar et al., "Data-Driven Fault Detection in Aircraft Engines With Noisy Sensor Measurements" Aug. 2011, Journal of Engineering for Gas Turbines and Power, vol. 133. (Year: 2011).*
Kaiser et al., "Predictive Maintenance Management Methods Using Sensor-Based Degradation Models" Jul. 2009, IEEE Transactions on Systems, Man, and Cybernetics—Part A: Systems and Humans, vol. 39, No. 4, pp. 840-849. (Year: 2009).*
Hover et al., "Advanced perception, navigation, and planning for autonomous in-water ship hull inspection" 2012 International Journal of Robotics Research, pp. 1445-1464. (Year: 2012).*
Li et al., "Gearbox fault diagnosis based on deep random forest fusion of acoustic and vibratory signals" Feb. 15, 2016, Mechanical Systems and Signal Processing, pp. 283-293. (Year: 2016).*
Czichos, Horst, "Handbook of Technical Diagnostics" 2013, Springer, pp. i-22. (Year: 2013).*
Dang et al., "SAFE—Sensor & Actuator for Contextual Services and Predictive Maintenance a Low Cost Industrial IoT Implementation for Industry 4.0" May 2016, ICSSEA, pp. 1-8. (Year: 2016).*
Alam et al., "Online Prognostics of Aircraft Turbine Engine Components Remaining Useful Life (RUL)" 2014, IEEE. (Year: 2014).*
Keerqinhu et al., "Fault-Diagnosis for Reciprocating Compressors Using Big Data" Mar. 29-Apr. 1, 2016, IEEE Second International Conference on Big Data Computing Service and Applications, pp. 72-81. (Year: 2016).*
More et al., "A Reconfigurable Smart Sensor Interface for Industrial WSN in IoT Environment" 2016. (Year: 2016).*
Xiongzi et al., "Remaining Useful Life Prognostic Estimation for Aircraft Subsystems or Components: A Review" 2011, IEEE the Tenth International Conference on Electronic Measurement & Instruments, pp. 94-98. (Year: 2011).*
Xue et al., "An Instance-Based Method for Remaining Useful Life Estimation for Aircraft Engines" Mar. 7, 2008, pp. 199-206. (Year: 2008).*
Zhang et al., "Remaining Useful Life Prediction for Rolling Element Bearing Based on Ensemble Learning" 2013, pp. 157-162. (Year: 2013).*
General Dynamics, press release "General Dynamics Releases NSA-Approved TACLANE Trusted Sensor Software" Apr. 30, 2015. (Year: 2015).*
Fuentes, David "Deep Packet Inspection for Physics-Based Anomaly Detection in Industrial Control Systems" 2016, Doctoral Dissertation, University of Texas at Dallas, pp. i-144. (Year: 2016).*

(56) References Cited

OTHER PUBLICATIONS

Liu et al., "Effective Sensor Selection and Data Anomaly Detection for Condition Monitoring of Aircraft Engines" Apr. 29, 2016, vol. 16, No. 623, pp. 1-17. (Year: 2016).*

Liu et al., "Distributed Sensor Network-on-Chip for Performance Optimization of Soft-Error-Tolerant Multiprocessor System-on-Chip" Mar. 18, 2016, IEEE, pp. 1546-1559. (Year: 2016).*

Gross et al., "Flight-Test Evaluation of Sensor Fusion Algorithms for Attitude Estimation" 2012, IEEE, pp. 2128-2139. (Year: 2012).*

Zhou et al., "Anomaly Detection from Distributed Flight Record Data for Aircraft Health Management" 2010, IEEE, pp. 156-159. (Year: 2010).*

Minet et al., "Adaptive Wireless Sensor Networks for Aircraft" Dec. 14-16, 2015, IEEE. (Year: 2015).*

Ntalampiras, Stavros "Fault Identification in Distributed Sensor Networks Based on Universal Probabilistic Modeling" Sep. 2015, IEEE, pp. 1939-1949. (Year: 2015).*

Rhudy et al., "Aircraft Model-Independent Airspeed Estimation Without Pitot Tube Measurements" Jul. 2015, IEEE, pp. 1980-1995. (Year: 2015).*

Sampigethaya et al., "Aviation Cyber-Physical Systems: Foundations for Future Aircraft and Air Transport" Aug. 2013, IEEE, pp. 1834-1855. (Year: 2013).*

Tian et al., "UAV Flight Test Evaluation of Fusion Algorithms for Estimation of Angle of Attack and Sideslip Angle" Jan. 4-8, 2016, AIAA, pp. 1-14. (Year: 2016).*

Vujic, Dragoljub "Wireless Sensor Networks Applications in Aircraft Structural Health Monitoring" 2015, Journal of Applied Engineering Science, pp. 79-86. (Year: 2015).*

Lin, Cheng-Chun et al.; Using real-time sensing data for predicting future state of building fires;2015 IEEE International Conference on Automation Science and Engineering (CASE); Aug. 24-28, 2015; pp. 1313-1318.

* cited by examiner

SENSOR BASED SYSTEM STATE PREDICTION

FIELD

The present invention relates generally to a method for predicting system states and in particular to a method and associated system for determining a predicted future state and associated operational attributes for a hardware system.

BACKGROUND

Processes for determining a state for a dynamic system comprising changing parameters over time are well known. A large number of solutions currently exist with respect to defining states through a set of dynamically changing parameters measured by sensors. Types and associated operational modes for individual sensors (e.g., data acquisition platforms) may vary depending on a system at hand. Similarly, measuring a set of parameters at any given point in time may directly provide information with respect to a status-quo of a system at the given point in time. However, predicting a future state of the system may comprise more valid information with respect to current information. Current solutions for predicting a future state of the system may comprise comparing a status-quo of a system to a previous point in time with respect to the system being in a same or a comparable state and predicting future development from past development. For example, if a person is allergic to a substance XX and had an allergic reaction to a substance YY in the past and the person recently ate substance YY and shows similar allergic symptoms, it may be determined that a specified antidote (e.g., drug PP or LL) was originally administered. Additionally, a reaction to the antidote may be determined. Therefore (assuming the person's reaction comprises a same reaction), probable effects with respect to administering the drug PP or LL to the person may be determined. The aforementioned process may comprise a predictive reference modelling process.

However, the aforementioned solutions may be associated with a difficulty of learning and predicting future states of systems and may scale exponentially with a large number of parameters (and a speed at which parameters change over time) describing such systems. As a result, the current solutions do not comprise an effective means for accurately predicting future states for systems.

Accordingly, there exists a need in the art to generate reference models for complex systems in real-time thereby allowing a quick and accurate determination of future states with respect to current predictive modelling tools.

SUMMARY

A first aspect of the invention provides a distributed sensor network based predictive method comprising: receiving, by a processor of a hardware device from a first integrated circuit, a first reference model associated with a first operational attribute of a hardware system, wherein the first integrated circuit internally comprises a first processing circuit and a first sensor, wherein the first sensor measures a first parameter of the hardware system, and wherein the first processing circuit generates the first reference model based on the first parameter; receiving, by the processor from a second integrated circuit, a second reference model associated with a second operational attribute of the hardware system, wherein the second integrated circuit internally comprises a second processing circuit and a second sensor, wherein the second sensor measures a second parameter of the hardware system, wherein the second processing circuit generates the second reference model based on the second parameter, wherein the second operational attribute differs from the first operational attribute, and wherein the second parameter differs from the first parameter; generating, by the processor, a combination reference model based on the first reference model and the second reference model; and generating, by the processor based on the combination reference model, a predicted future state and associated operational attributes for the hardware system.

A second aspect of the invention provides a computer program product, comprising a computer readable hardware storage device storing a computer readable program code, the computer readable program code comprising an algorithm that when executed by a processor of a hardware device implements a distributed sensor network based predictive method, the method comprising: receiving, by the processor from a first integrated circuit, a first reference model associated with a first operational attribute of a hardware system, wherein the first integrated circuit internally comprises a first processing circuit and a first sensor, wherein the first sensor measures a first parameter of the hardware system, and wherein the first processing circuit generates the first reference model based on the first parameter; receiving, by the processor from a second integrated circuit, a second reference model associated with a second operational attribute of the hardware system, wherein the second integrated circuit internally comprises a second processing circuit and a second sensor, wherein the second sensor measures a second parameter of the hardware system, wherein the second processing circuit generates the second reference model based on the second parameter, wherein the second operational attribute differs from the first operational attribute, and wherein the second parameter differs from the first parameter; generating, by the processor, a combination reference model based on the first reference model and the second reference model; and generating, by the processor based on the combination reference model, a predicted future state and associated operational attributes for the hardware system.

A third aspect of the invention provides a hardware device comprising a computer processor coupled to a computer-readable memory unit, the memory unit comprising instructions that when executed by the computer processor implements a distributed sensor network based predictive method comprising: receiving, by the processor from a first integrated circuit, a first reference model associated with a first operational attribute of a hardware system, wherein the first integrated circuit internally comprises a first processing circuit and a first sensor, wherein the first sensor measures a first parameter of the hardware system, and wherein the first processing circuit generates the first reference model based on the first parameter; receiving, by the processor from a second integrated circuit, a second reference model associated with a second operational attribute of the hardware system, wherein the second integrated circuit internally comprises a second processing circuit and a second sensor, wherein the second sensor measures a second parameter of the hardware system, wherein the second processing circuit generates the second reference model based on the second parameter, wherein the second operational attribute differs from the first operational attribute, and wherein the second parameter differs from the first parameter; generating, by the processor, a combination reference model based on the first reference model and the second reference model; and generating, by the processor based on the combination reference model, a predicted future state and associated operational attributes for the hardware system.

A fourth aspect of the invention provides a sensor based predictive method comprising: initializing, by a first processing circuit internal to a first integrated circuit, a first sensor internal to the first integrated circuit; measuring, by the first sensor, a first parameter of a hardware system; generating based on the first parameter, by the first processing circuit, a first reference model associated with a first operational attribute of the hardware system; and transmitting, by the first integrated circuit to a processor of a hardware device, the first reference model, wherein a second reference model associated with a second operational attribute of the hardware system is received by the processor from a second integrated circuit, wherein the second integrated circuit internally comprises a second processing circuit and a second sensor, wherein the second sensor measures a second parameter of the hardware system, wherein the second processing circuit generates the second reference model based on the second parameter, wherein the second operational attribute differs from the first operational attribute, wherein the second parameter differs from the first parameter, wherein the a combination reference model is generated by the processor based on the first reference model and the second reference model, and wherein a predicted future state and associated operational attributes are generated for the hardware system based on the combination reference model.

A fifth aspect of the invention provides a computer program product, comprising a computer readable hardware storage device storing a computer readable program code, the computer readable program code comprising an algorithm that when executed by a first processing circuit internal to a first integrated circuit implements sensor based predictive method, the method comprising: initializing, by the first processing circuit, a first sensor internal to the first integrated circuit; measuring, by the first sensor, a first parameter of a hardware system; generating based on the first parameter, by the first processing circuit, a first reference model associated with a first operational attribute of the hardware system; and transmitting, by the first integrated circuit to a processor of a hardware device, the first reference model, wherein a second reference model associated with a second operational attribute of the hardware system is received by the processor from a second integrated circuit, wherein the second integrated circuit internally comprises a second processing circuit and a second sensor, wherein the second sensor measures a second parameter of the hardware system, wherein the second processing circuit generates the second reference model based on the second parameter, wherein the second operational attribute differs from the first operational attribute, wherein the second parameter differs from the first parameter, wherein the combination reference model is generated by the processor based on the first reference model and the second reference model, and wherein a predicted future state and associated operational attributes are generated for the hardware system based on the combination reference model.

The present invention advantageously provides a simple method and associated system capable of accurately predicting future states for systems.

DETAILED DESCRIPTION

Figure 1:
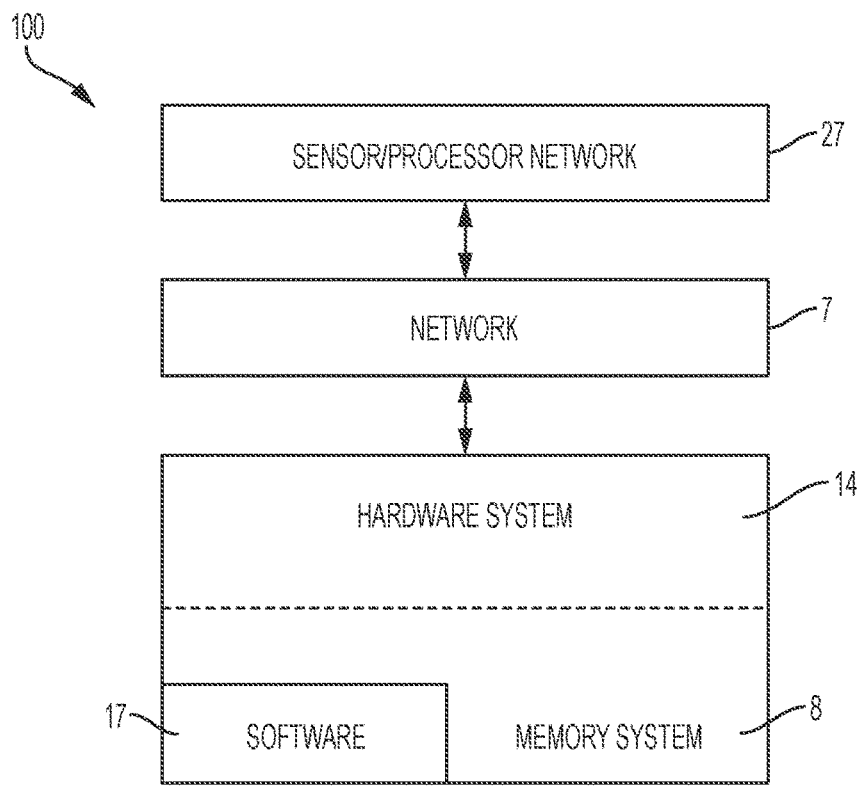
FIG. 1 illustrates a system for determining a predicted future state and associated operational attributes for a hardware system, in accordance with embodiments of the present invention.

FIG. 1 illustrates a system 100 for determining a predicted future state and associated operational attributes for a hardware system 14, in accordance with embodiments of the present invention. Typical operational attribute analysis systems may analyze operational data at rest. For example, operational data located in a data warehouse via a centralized model associated with a centralized analytical reference model. Alternatively, operational attribute analysis systems may analyze operational data in motion moving across a network. For example, operational data may be analyzed via usage of a streaming video analysis comprising deep packet inspection in a distributed model. The aforementioned process may include usage of multiple distributed stream computing platforms querying data for patterns such that an analytical reference model is distributed across the multiple distributed stream computing platforms. Each stream computer queries data in motion to determine a match to an associated reference model. Therefore, system 100 enables dynamic and evolving analytical reference models to be distributed across edge sensor platforms (i.e., comprising the sensors embedded in a microprocessor deployed at an edge platform).

System 100 enables a data analytics platform for predicting a future state of a system or multiple classes of systems (e.g., a hardware system 14, a software system, a waterway system, an environmental system, etc.). The data analytics platform may include at least two sensors measuring at least two different parameters of the system. Each sensor includes a respective reference model to predict a future state of the parameter being measured. Predicted states for each of the parameters are combined to predict a future state of the system. Each sensor builds a predictive reference model for input into an umbrella reference model.

System 100 of FIG. 1 includes a sensor/processor network 27 connected through a network 7 to a hardware system 14. Sensor/processor network 27 and hardware system 14 each may comprise an embedded computer. An embedded computer is defined herein as a dedicated computer comprising a combination of computer hardware and software (fixed in capability or programmable) specifically designed for executing a specialized function. Programmable embedded computers may comprise specialized programming interfaces. Additionally, sensor/processor network 27 and hardware system 14 may each comprise a specialized hardware device comprising specialized (non-generic) hardware and circuitry (i.e., specialized discrete non-generic analog, digital, and logic based circuitry) for executing a process described with respect to FIGS. 1-6. The specialized discrete non-generic analog, digital, and logic based circuitry may include proprietary specially designed components (e.g., a specialized integrated circuit designed for only implementing an automated process for determining a predicted future state and associated operational attributes for hardware system 14). Hardware system 14 includes a memory system 8 and software 17. The memory system 8 may include a single memory system. Alternatively, the memory system 8 may include a plurality of memory systems. Sensor/processor network 27 comprises sensors, processors, and reference models as further described, infra, with respect to FIG. 2. Sensors may include, inter alia, GPS sensors, RFID sensors, temperature sensors, infrared sensors, a video retrieval device, pressure sensors, and flow sensors, etc. Network 7 may include any type of network including, inter alia, a local area network, (LAN), a wide area network (WAN), the Internet, a wireless network, etc.

System 100 enables a data analytics platform using dynamic reference modelling with respect to system parameters to predict a future state of the system as follows:

A processor generates and updates (in real-time) independent reference models for each associated sensor. A resulting joint reference model for the entire system (i.e., hardware system 14) is generated in real-time via usage of the independent reference models. The resulting joint reference model may be implemented as, inter alia, a distributed model, a federal mode, etc. The resulting joint reference model is analyzed to predict a future state of the system. Each processor may use a same data processing algorithm for each sensor. Alternatively, each processor may use a differing data processing algorithm for each sensor. A data processing algorithm may employ technology from the following technologies: deep learning technology, machine learning technology, etc. Each sensor may include an integrated analytics platform. Alternatively, system 100 may comprise an analytics platform independent from all sensors.

The following example describes an implementation scenario for determining a predicted future state and associated operational attributes for hardware system 14 as follows:

Remote vehicles comprising low power and portable chips (capable of performing advanced cognitive analytics tasks for image recognition and video surveillance) are configured to perform image recognition tasks (including real-time analysis of images and contextualizing this data with environmental data) with respect to brushfire control of a large geographical area. Remote vehicles may comprise any vehicle that does not require a human operator to be located within the vehicle such as, inter alia, a remote controlled vehicle (e.g., an aircraft flown by a pilot at a ground control station), an autonomously controlled vehicle (e.g., an aircraft controlled based on pre-programmed flight plans and may include an intelligence algorithm that would enable a vehicle to know it's location and self-determine a an item delivery route), a pre-programmed vehicle, etc. Alternatively, a remote vehicle may comprise any type of vehicle that includes a human operator located within the vehicle (e.g., an aircraft, an automobile, a boat or ship, a train, etc.). A remote vehicle may include, inter alia, an aerial vehicle, a land based vehicle, a marine (water) based vehicle, etc. The remote vehicles perform a process via usage of swarm intelligence with respect to three vehicles each comprising image sensors, infrared sensors, and gas spectrometers as follows:

A first vehicle (comprising an integrated camera and GPS) is instructed to fly over a geographical area. The first vehicle has been loaded with visual parameters associated with the geographical area. As the first vehicle flies over the geographical area, a normal reference model describing the geographical area is defined in real-time. Any detected changes to the geographical area are compared to a previous reference model and in response it is determined that smoke has been detected and therefore a brushfire is occurring. The first vehicle uses the imagery (retrieved from the integrated camera) and GPS data combined with a flight path of the first vehicle to calculate a wind direction and strength to determine a location that the fire may spread to. In response, a second vehicle (comprising an integrated infrared sensor and GPS) is dispatched to verify a temperature profile at the geographical location. As the second vehicle flies over the geographical area, it records and updates a reference temperature profile and determines that a temperature of a specified location (within the geographical area) that does not include any detected smoke comprises a temperature about 80 degrees lower than a location comprising detected smoke. Therefore, it is determined that there is probably not a fire at the specified location. In response, a third vehicle (comprising an integrated gas spectrometer and GPS) is dispatched to determine a chemical signature of the air surrounding the specified location. As the third vehicle flies over the specified location, it continuously collects chemical data with respect to airflow during and constantly updates and monitors changes in a chemical profile over time. Therefore, it is determined (based on the responses from all three vehicles) that there is no current (and future) brushfire at the specified location.

Figure 2:
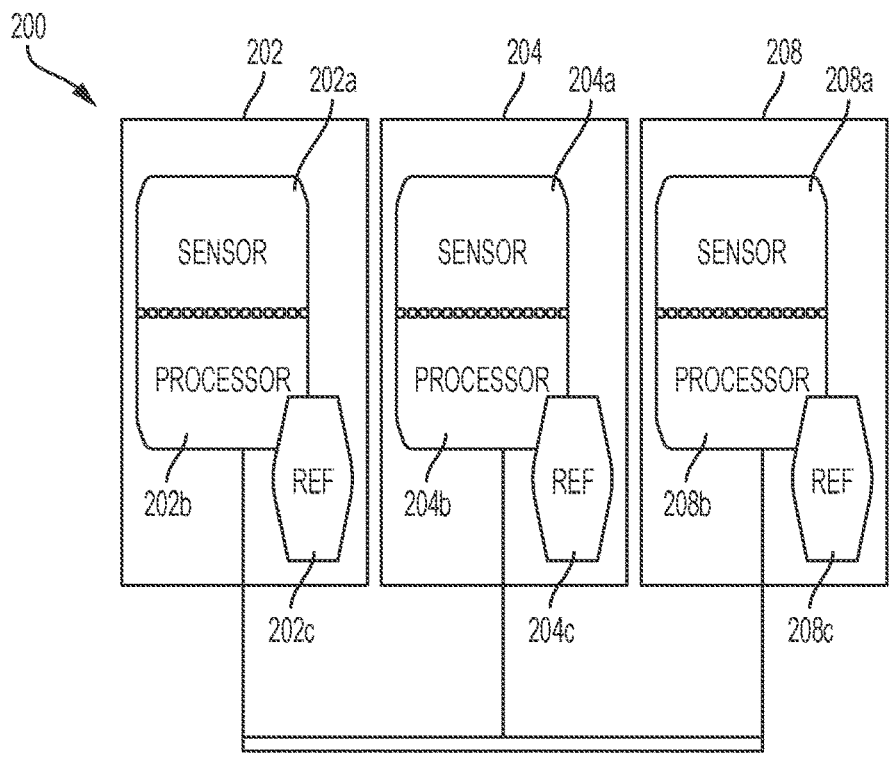
FIG. 2 illustrates a detailed view of a sensor/processor network, in accordance with embodiments of the present invention.

FIG. 2 illustrates a detailed view of sensor/processor network 27, in accordance with embodiments of the present invention. FIG. 2 comprises a distributed sensor network 200 comprising integrated circuits 202, 204, and 208. Integrated circuit 202 comprises a fully integrated operating unit that includes a sensor 202a, a processor 202b, and a reference model 202c. Integrated circuit 204 comprises a fully integrated operating unit that includes a sensor 204a, a processor 204b, and a reference model 204c. Integrated circuit 208 comprises a fully integrated operating unit that includes a sensor 208a, a processor 208b, and a reference model 208c. Each of processors 202b, 204b, and 208b are connected to and communicate with each other. Upon activation of distributed sensor network 200, each of sensors 202a, 204a, and 208a collects data in (i.e., in an always-on state) and feeds the data directly into its associated (on-chip) processor (i.e., processors 202b, 204b, and 208b) for analyses in real time. Each of processors 202b, 204b, and 208bemploys a same built-in starting reference model used to predict a future state of the monitored system based on continuous data analysis. Each of processors 202b, 204b, and 208b update its associated reference model at any time and individually based on input from its own sensor and/or based on input from other processors in the network. Distributed sensor network 200 enables a process for performing: distributed analytics (i.e., sensor data is analyzed via each integrated circuit at a point of sensing in real-time) and distributed reference modelling (i.e., each processor uses its own local reference model for data analysis that may be and independently updated at any time. Each of processors 202b, 204b, and 208bshare independent updates for their associated reference models with each other thereby updating associated local reference models. Reference models 202c, 204c, and 208c are generated based on applying pattern recognition algorithms to training datasets to define different states of a system (e.g., hardware system 14 of FIG. 1). Pattern recognition algorithms may be associated with machine learning and deep learning processes. Training data sets may comprise data streams retrieved from any type of sensor. Sensors 202a, 204a, and 208a may comprise any type of sensor for continuously measuring a parameter of a system in real-time. Processors 202b, 204b, and 208b may comprise neuromorphic platform processors, non-von-Neumann architecture processors, processors capable of running machine learning algorithms, processors capable of executing deep learning algorithms such as neural networks, etc. Neural network algorithms may comprise fully connected layer networks, recurrent neural networks, convolutional neural networks, deep belief networks, etc.

The following example describes an implementation scenario for executing an algorithm for determining a predicted future state and associated operational attributes for a hardware system as follows:

With respect to the example, sensor 202acomprises a kerosene flow sensor, sensor 204a comprises a GPS sensor, and sensor 208a comprises a microphone. The hardware system comprises a jet engine of an airplane. Sensors 202a, 204a, and 208a employ (i.e. update and have access to) a same starting reference model comprising three reference components. A first reference model component is measured by sensor 202a (kerosene flow sensor) and is generated based on kerosene flow patterns into a running jet engine in a normal operational state. A second reference model component is measured by sensor 204a (GPS sensor) and is linked to a map comprising weather related data for a planned flight route. A third reference model component is measured by sensor 208a (microphone) and comprises an acoustic profile for a running jet engine in a normal operational state.

The process is initiated when the microphone retrieves a noise pattern that differs from a normal operating state thereby suggesting the engine is powering down. Therefore, the distributed sensor network 200 generates an engine powering down alert to all processors in the network. Likewise, the kerosene sensor measures a decreasing kerosene flow additionally suggesting that the engine is powering down and transmits an alert confirmation to all processors in the system. The GPS sensor measures an unchanged travel velocity of the airplane and additionally uses tailwind information for a current location and additional portions of the flight to calculate adjusted engine RPM and kerosene consumption levels. The new parameters are transmitted back to the flow sensor and the microphone and matched with respective sound and flow patterns in their local reference models. The alert is terminated and all sensors update their local reference model such that the new noise and kerosene flow patterns (differing from the normal states in their initial reference model calibration) are labelled as normal and do not raise alerts throughout the flight whenever linked to respective tailwind locations as determined by the GPS. Therefore, all processors continuously analyze data from their associated sensors and immediately report any new state differing from updated local reference models to all other processors for referencing. Distributed sensor network 200 enables a reference model to continuously and autonomously operate, learn, and adapt without any human supervision or intervention. Additionally, each of sensors 202a, 204a, and 208a function in combinations such that they are continuously improving and enable real-time response to measurement results without a need to stream sensor data.

Figure 3:
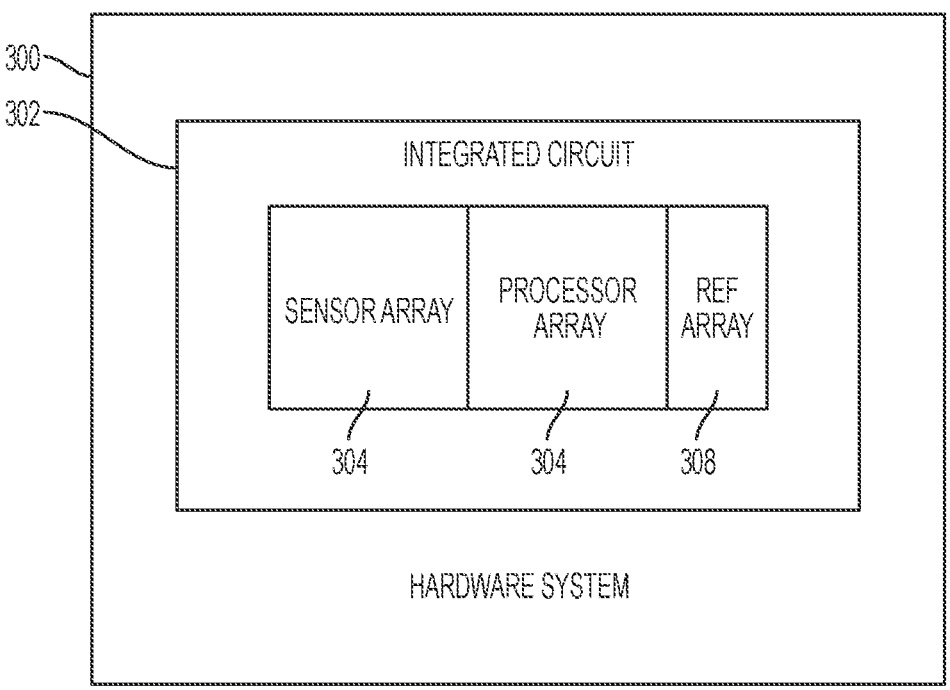
FIG. 3 illustrates an alternative hardware system with respect to the systems of FIGS. 1 and 2, in accordance with embodiments of the present invention.

FIG. 3 illustrates an alternative hardware system 300 with respect to the systems of FIGS. 1 and 2, in accordance with embodiments of the present invention. In contrast to FIGS. 1 and 2, (monitored) hardware system 300 comprises a single internal (i.e., internal to the hardware system 300) integrated circuit 302 comprising an internal sensor array 304, an internal processor array 304, and an internal reference model array 308. The internal sensor array 304 comprises multiple sensors communicatively connected for sensing differing parameters of hardware system 300. The internal processor array 304 comprises multiple processors communicatively connected for analyzing data from the sensors. Reference model array 308 comprises multiple reference models.

Figure 4:
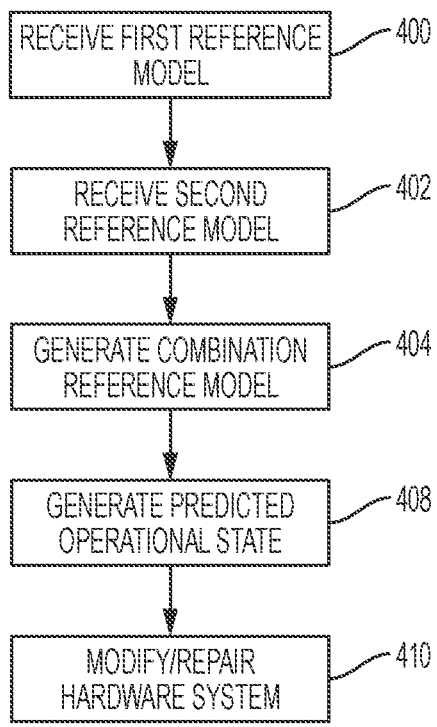
FIG. 4 illustrates an algorithm detailing a process flow enabled by the systems of FIGS. 1-3 for executing a distributed sensor network based predictive method, in accordance with embodiments of the present invention.

FIG. 4 illustrates an algorithm detailing a process flow enabled by the systems of FIGS. 1-3 for executing a distributed sensor network based predictive method, in accordance with embodiments of the present invention. Each of the steps in the algorithm of FIG. 4 may be enabled and executed in any order by a computer processor(s) executing computer code. In step 400, a first reference model associated with a first operational attribute of a hardware system is received (by a hardware device) from a first integrated circuit. The first integrated circuit internally comprises a first processing circuit and a first sensor. The first processing circuit may be integrated with or independent from the first sensor. The first sensor measures a first parameter of the hardware system and the first processing circuit generates the first reference model based on the first parameter (via execution of a first executable algorithm). In step 402, a second reference model associated with a second operational attribute of the hardware system is received from a second integrated circuit communicatively connected to the first integrated circuit. The second integrated circuit internally comprises a second processing circuit and a second sensor. The second processing circuit may be integrated with or independent from the second sensor. The second sensor measures a second parameter of the hardware system. The first sensor and the second sensor may comprise any type of sensor including, inter alia, a GPS sensor, an RFID sensor, a temperature sensor, an infrared sensor, a video retrieval device, a pressure sensor, and a flow sensor. The second processing circuit generates the second reference model based on the second parameter (via execution of a second executable algorithm differing from or the same as the first executable algorithm). The second operational attribute differs from the first operational attribute and the second parameter differs from the first parameter. In step 404, a combination reference model is generated based on the first reference model and the second reference model. In step 408, a predicted future state and associated operational attributes for the hardware system are generating based on the combination reference model. In step 410, the hardware system is modified and/or repaired based on the predicted future state and associated operational attributes. For example, hardware components (e.g., memory devices, integrated circuits, electrical components (resistors, transistors, capacitors, inductors, etc.), structural components (e.g., a heat sink), electro/mechanical components (e.g., motors, solenoids, etc.) may be repaired or replaced.

Figure 5:
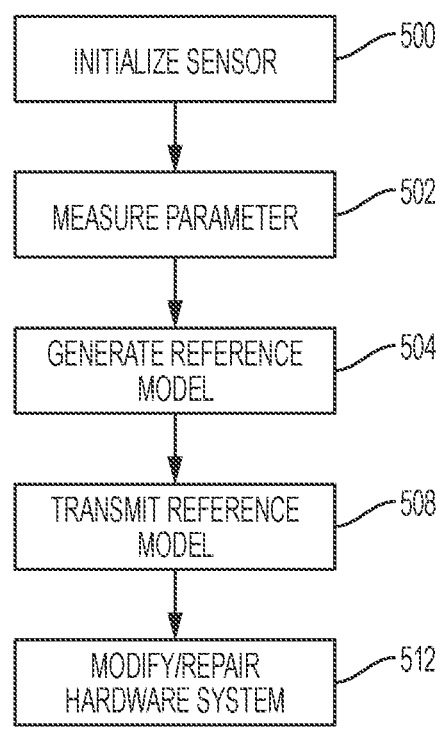
FIG. 5 illustrates an alternative algorithm to the algorithm of FIG. 4 detailing an alternative process flow enabled by the systems of FIGS. 1-3 for executing distributed sensor network based predictive method, in accordance with embodiments of the present invention.

FIG. 5 illustrates an alternative algorithm to the algorithm of FIG. 4 detailing an alternative process flow enabled by the systems of FIGS. 1-3 for executing distributed sensor network based predictive method, in accordance with embodiments of the present invention. Each of the steps in the algorithm of FIG. 5 may be enabled and executed in any order by a computer processor(s) executing computer code.

In step 500, a first sensor is initialized by a first processing circuit. The first sensor and the first processing circuit may be internal to a first integrated circuit. In step 502, a first parameter of a hardware system is measured by the first sensor. In step 504, a first reference model associated with a first operational attribute of the hardware system is generated based on the first parameter. In step 508, the first reference model is transmitted (by the first integrated circuit) to a processor of a hardware device. Additionally, a second reference model (associated with a second operational attribute of the hardware system) is received by the processor (from a second integrated circuit). The second integrated circuit internally comprises a second processing circuit and a second sensor. The second sensor measures a second parameter of the hardware system and the second processing circuit generates the second reference model based on the second parameter. The second operational attribute may differ from the first operational attribute and the second parameter may differ from the first parameter. Additionally, a combination reference model is generated by the processor based on the first reference model and the second reference model and a predicted future state and associated operational attributes are generated for the hardware system based on the combination reference model. In step 512, the hardware system is modified and/or repaired based on the predicted future state and associated operational attributes. For example, hardware components (e.g., memory devices, integrated circuits, electrical components (resistors, transistors, capacitors, inductors, etc.), structural components (e.g., a heat sink), electro/mechanical components (e.g., motors, solenoids, etc.) may be repaired or replaced.

Figure 6:
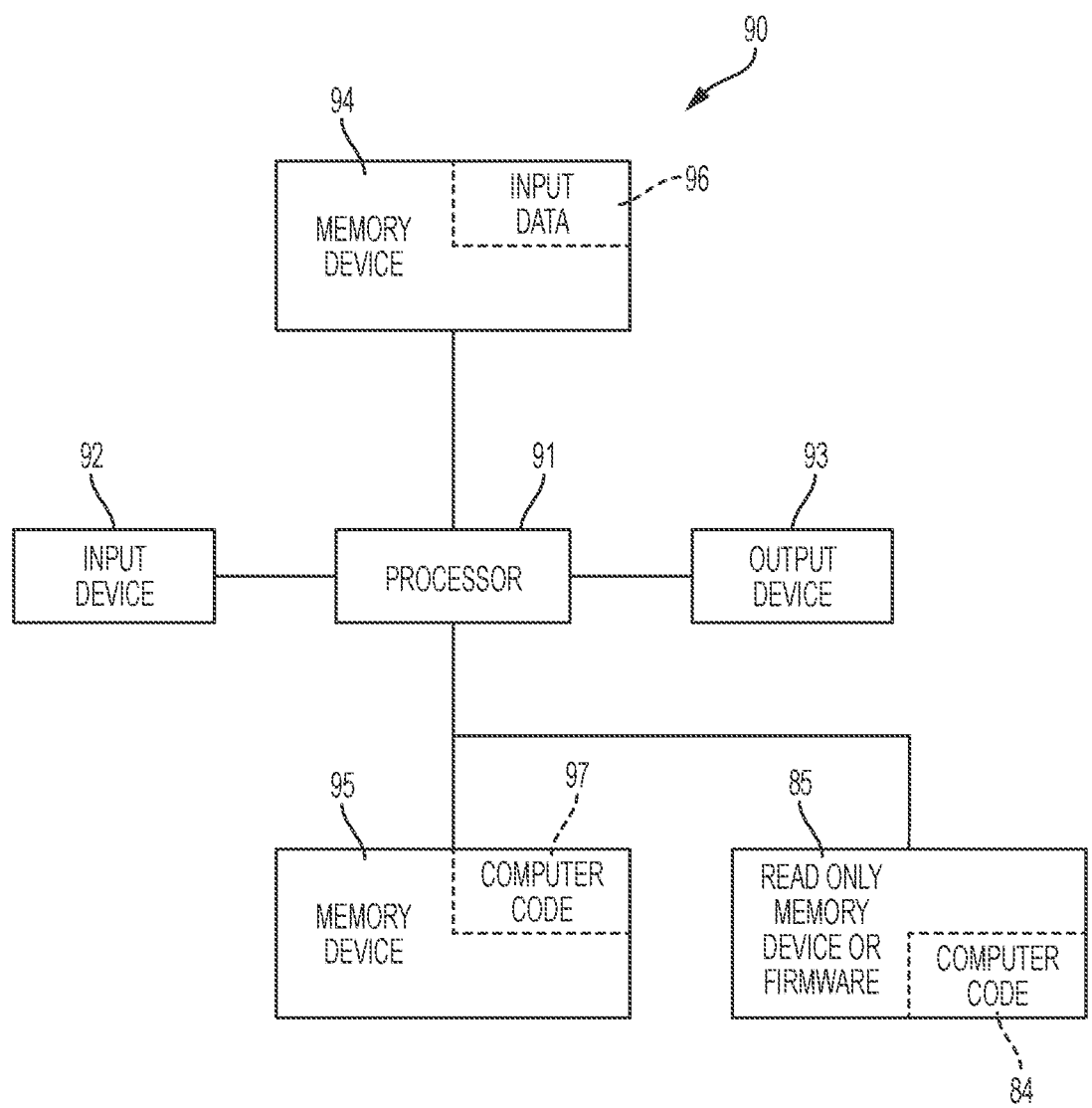
FIG. 6 illustrates a computer system used by the systems of FIGS. 1-3 for determining a predicted future state and associated operational attributes for a hardware system, in accordance with embodiments of the present invention.

FIG. 6 illustrates a computer system 90 (e.g., sensor/processor network 27, hardware systems 14 and 300 and integrated circuits 202, 204, 208, and 302) used by or comprised by the systems of FIGS. 1-3 for determining a predicted future state and associated operational attributes for a hardware system, in accordance with embodiments of the present invention.

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing apparatus receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, device (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing device to produce a machine, such that the instructions, which execute via the processor of the computer or other programmable data processing device, create means for implementing the functions/acts specified in the flowchart and/or block diagram block or blocks. These computer readable program instructions may also be stored in a computer readable storage medium that can direct a computer, a programmable data processing device, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing device, or other device to cause a series of operational steps to be performed on the computer, other programmable device or other device to produce a computer implemented process, such that the instructions which execute on the computer, other programmable device, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The computer system 90 illustrated in FIG. 6 includes a processor 91, an input device 92 coupled to the processor 91, an output device 93 coupled to the processor 91, and memory devices 94 and 95 each coupled to the processor 91. The input device 92 may be, inter alia, a keyboard, a mouse, a camera, a touchscreen, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes algorithms (e.g., the algorithms of FIGS. 4-5) for enabling a process for determining a predicted future state and associated operational attributes for a hardware system. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices Such as read only memory device 96) may include algorithms (e.g., the algorithms of FIGS. 4-5) and may be used as a computer usable medium (or a computer readable medium or a program storage device) having a computer readable program code embodied therein and/or having other data stored therein, wherein the computer readable program code includes the computer code 97. Generally, a computer program product (or, alternatively, an article of manufacture) of the computer system 90 may include the computer usable medium (or the program storage device).

In some embodiments, rather than being stored and accessed from a hard drive, optical disc or other writeable, rewriteable, or removable hardware memory device 95, stored computer program code 84 (e.g., including algorithm) may be stored on a static, nonremovable, read-only storage medium such as a Read-Only Memory (ROM) device 85, or may be accessed by processor 91 directly from such a static, nonremovable, read-only medium 85. Similarly, in some embodiments, stored computer program code 97 may be stored as computer-readable firmware 85, or may be accessed by processor 91 directly from such firmware 85, rather than from a more dynamic or removable hardware data-storage device 95, such as a hard drive or optical disc.

Still yet, any of the components of the present invention could be created, integrated, hosted, maintained, deployed, managed, serviced, etc. by a service supplier who offers to determine a predicted future state and associated operational attributes for a hardware system. Thus, the present invention discloses a process for deploying, creating, integrating, hosting, maintaining, and/or integrating computing infrastructure, including integrating computer-readable code into the computer system 90, wherein the code in combination with the computer system 90 is capable of performing a method for determining a predicted future state and associated operational attributes for a hardware system. In another embodiment, the invention provides a business method that performs the process steps of the invention on a subscription, advertising, and/or fee basis. That is, a service supplier, such as a Solution Integrator, could offer to enable a process for determining a predicted future state and associated operational attributes for a hardware system. In this case, the service supplier can create, maintain, support, etc. a computer infrastructure that performs the process steps of the invention for one or more customers. In return, the service supplier can receive payment from the customer(s) under a subscription and/or fee agreement and/or the service supplier can receive payment from the sale of advertising content to one or more third parties.

While FIG. 6 shows the computer system 90 as a particular configuration of hardware and software, any configuration of hardware and software, as would be known to a person of ordinary skill in the art, may be utilized for the purposes stated supra in conjunction with the particular computer system 90 of FIG. 6. For example, the memory devices 94 and 95 may be portions of a single memory device rather than separate memory devices.

While embodiments of the present invention have been described herein for purposes of illustration, many modifications and changes will become apparent to those skilled in the art.

Accordingly, the appended claims are intended to encompass all such modifications and changes as fall within the true spirit and scope of this invention.

What is claimed is:

1. A distributed sensor network based predictive method comprising:

receiving, by a processor of a hardware system from a first integrated circuit, a first reference model associated with a first operational attribute of a hardware system, wherein said hardware system comprises a vehicular hardware control device of a vehicle, wherein said vehicle comprises a flight based vehicle, wherein said first integrated circuit internally comprises a first processing circuit and a first sensor embedded within said first integrated circuit, wherein said first integrated circuit is deployed with respect to an edge platform, wherein said first sensor measures a first operational parameter of said vehicular hardware control device, wherein said first operational parameter comprises a first fuel flow pattern associated with a fuel flowing to said vehicular hardware control device, and wherein said first processing circuit generates said first reference model based on said first operational parameter;

receiving, by said processor from a second integrated circuit, a second reference model associated with a second operational attribute of said hardware system, wherein said second integrated circuit internally comprises a second processing circuit and a second sensor embedded within said second integrated circuit, wherein said second integrated circuit is deployed with respect to said edge platform, wherein said second sensor comprises a microphone, wherein said second sensor measures a second operational parameter of said vehicular hardware control device, wherein said second processing circuit generates said second reference model based on said second operational parameter, wherein said second operational attribute differs from said first operational attribute, wherein said second operational parameter differs from said first operational parameter, and wherein said second operational parameter comprises an acoustical parameter associated with operational acoustics of said vehicular hardware control device;

receiving, by said processor from a third integrated circuit, a third reference model associated with a third operational attribute of said hardware system, wherein said third integrated circuit internally comprises a third processing circuit and a third sensor embedded within said third integrated circuit, wherein said third integrated circuit is deployed with respect to said edge platform, wherein said third sensor comprises a GPS sensor linked to a weather related map associated with a preplanned flight route of said vehicle, wherein said third sensor measures a third operational parameter of said vehicular hardware control device, wherein measuring said third operational parameter comprises measuring an unchanged travel velocity of said vehicle and tailwind information for a current vehicular location and measuring an adjusted engine RPM level and fuel consumption levels for said vehicle, wherein said third processing circuit generates said third reference model based on said third operational parameter, wherein said third operational attribute differs from said first operational attribute and said second operational attribute, and wherein said third operational parameter differs from said first operational parameter and said second operational parameter;

analyzing, by said processor, said first operational attribute, said second operational attribute, and said third operational attribute via usage of a streaming video analysis comprising deep packet inspection;

generating, by said processor based on results of said analyzing, a combination reference model based on said first reference model, said second reference model, and said third reference model;

generating, by said processor based on said combination reference model, a predicted future state and associated operational attributes for said hardware system;

determining, by said processor based on said acoustical parameter, said first fuel flow pattern, said unchanged travel velocity of said vehicle, said tailwind information for said current vehicular location, said adjusted engine RPM level and fuel consumption levels for said vehicle, and said combination reference model, that said vehicular hardware control device is powering down;

continuously and autonomously operating and adapting without any human supervision or intervention, by said processor based on said predicted future state, said combination reference model; and determining, by said processor based on said predicted future state and results of said determining that said vehicular hardware control device is powering down, repair options associated with electro/mechanical components of said hardware system.

2. The method of claim 1, wherein said first processing circuit generates said first reference model via execution of a first executable algorithm, and wherein said second processing circuit generates said second reference model via execution of a second executable algorithm.

3. The method of claim 2, wherein said first executable algorithm differs from said second executable algorithm.

4. The method of claim 2, wherein said first executable algorithm comprises a same algorithm as said second executable algorithm.

5. The method of claim 1, wherein said first integrated circuit is communicatively connected to said second integrated circuit.

6. The method of claim 2, wherein said first executable algorithm and said second executable algorithm each comprises an algorithm selected from the group consisting of a deep learning algorithm and a machine learning algorithm.

7. The method of claim 1, wherein said first processing circuit is integrated with said first sensor, and wherein said second processing circuit is integrated with said second sensor.

8. The method of claim 1, wherein said first sensor and said second sensor each comprise a sensor selected from the group consisting of a GPS sensor, an RFID sensor, a temperature sensor, an infrared sensor, a video retrieval device, a pressure sensor, and a flow sensor.

9. The method of claim 1, further comprising:
providing at least one support service for at least one of creating, integrating, hosting, maintaining, and deploying computer-readable code in the hardware system, said code being executed by the computer processor to implement: said receiving said first reference model, said receiving said second reference model, said generating said combination reference model, and said generating said predicted future state and associated operational attributes for said hardware system.

10. A computer program product, comprising a computer readable hardware storage system storing a computer readable program code, said computer readable program code comprising an algorithm that when executed by a processor of a hardware device implements a distributed sensor network based predictive method, said method comprising:
receiving, by said processor from a first integrated circuit, a first reference model associated with a first operational attribute of a hardware system, wherein said hardware system comprises a vehicular hardware control device of a vehicle, wherein said vehicle comprises a flight based vehicle, wherein said first integrated circuit internally comprises a first processing circuit and a first sensor embedded within said first integrated circuit, wherein said first integrated circuit is deployed with respect to an edge platform, wherein said first sensor measures a first operational parameter of said vehicular hardware control device, wherein said first operational parameter comprises a first fuel flow pattern associated with a fuel flowing to said vehicular hardware control device, and wherein said first processing circuit generates said first reference model based on said first operational parameter;

receiving, by said processor from a second integrated circuit, a second reference model associated with a second operational attribute of said hardware system, wherein said second integrated circuit internally comprises a second processing circuit and a second sensor embedded within said second integrated circuit, wherein said second integrated circuit is deployed with respect to said edge platform, wherein said second sensor comprises a microphone, wherein said second sensor measures a second operational parameter of said vehicular hardware control device, wherein said second processing circuit generates said second reference model based on said second operational parameter, wherein said second operational attribute differs from said first operational attribute, wherein said second operational parameter differs from said first operational parameter, and wherein said second operational parameter comprises an acoustical parameter associated with operational acoustics of said vehicular hardware control device;

receiving, by said processor from a third integrated circuit, a third reference model associated with a third operational attribute of said hardware system, wherein said third integrated circuit internally comprises a third processing circuit and a third sensor embedded within said third integrated circuit, wherein said third integrated circuit is deployed with respect to said edge platform, wherein said third sensor comprises a GPS sensor linked to a weather related map associated with a preplanned flight route of said vehicle, wherein said third sensor measures a third operational parameter of said vehicular hardware control device, wherein measuring said third operational parameter comprises measuring an unchanged travel velocity of said vehicle and tailwind information for a current vehicular location and measuring an adjusted engine RPM level and fuel consumption levels for said vehicle, wherein said third processing circuit generates said third reference model based on said third operational parameter, wherein said third operational attribute differs from said first operational attribute and said second operational attribute, and wherein said third operational parameter differs from said first operational parameter and said second operational parameter;

analyzing, by said processor, said first operational attribute, said second operational attribute, and said third operational attribute via usage of a streaming video analysis comprising deep packet inspection;

generating, by said processor based on results of said analyzing, a combination reference model based on said first reference model, said second reference model, and said third reference model;

generating, by said processor based on said combination reference model, a predicted future state and associated operational attributes for said hardware system;

determining, by said processor based on said acoustical parameter, said first fuel flow pattern, said unchanged travel velocity of said vehicle, said tailwind information for said current vehicular location, said adjusted engine RPM level and fuel consumption levels for said vehicle, and said combination reference model, that said vehicular hardware control device is powering down;

continuously and autonomously operating and adapting without any human supervision or intervention, by said processor based on said predicted future state, said combination reference model; and determining, by said processor based on said predicted future state and results of said determining that said vehicular hardware control device is powering down, repair options associated with electro/mechanical components of said hardware system.

11. The computer program product of claim 10, wherein said first processing circuit generates said first reference model via execution of a first executable algorithm, and wherein said second processing circuit generates said second reference model via execution of a second executable algorithm.

12. The computer program product of claim 11, wherein said first executable algorithm differs from said second executable algorithm.

13. A hardware system comprising a computer processor coupled to a computer-readable memory unit, said memory unit comprising instructions that when executed by the computer processor implements a distributed sensor network based predictive method comprising:

receiving, by said processor from a first integrated circuit, a first reference model associated with a first operational attribute of a hardware system, wherein said hardware system comprises a vehicular hardware control device of a vehicle, wherein said vehicle comprises a flight based vehicle, wherein said first integrated circuit internally comprises a first processing circuit and a first sensor embedded within said first integrated circuit, wherein said first integrated circuit is deployed with respect to an edge platform, wherein said first sensor measures a first operational parameter of said vehicular hardware control device, wherein said first operational parameter comprises a first fuel flow pattern associated with a fuel flowing to said vehicular hardware control device, and wherein said first processing circuit generates said first reference model based on said first operational parameter;

receiving, by said processor from a second integrated circuit, a second reference model associated with a second operational attribute of said hardware system, wherein said second integrated circuit internally comprises a second processing circuit and a second sensor embedded within said second integrated circuit, wherein said second integrated circuit is deployed with respect to said edge platform, wherein said second sensor comprises a microphone, wherein said second sensor measures a second operational parameter of said vehicular hardware control device, wherein said second processing circuit generates said second reference model based on said second operational parameter, wherein said second operational attribute differs from said first operational attribute, wherein said second operational parameter differs from said first operational parameter, and wherein said second operational parameter comprises an acoustical parameter associated with operational acoustics of said vehicular hardware control device;

receiving, by said processor from a third integrated circuit, a third reference model associated with a third operational attribute of said hardware system, wherein said third integrated circuit internally comprises a third processing circuit and a third sensor embedded within said third integrated circuit, wherein said third integrated circuit is deployed with respect to said edge platform, wherein said third sensor comprises a GPS sensor linked to a weather related map associated with a preplanned flight route of said vehicle, wherein said third sensor measures a third operational parameter of said vehicular hardware control device, wherein measuring said third operational parameter comprises measuring an unchanged travel velocity of said vehicle and tailwind information for a current vehicular location and measuring an adjusted engine RPM level and fuel consumption levels for said vehicle, wherein said third processing circuit generates said third reference model based on said third operational parameter, wherein said third operational attribute differs from said first operational attribute and said second operational attribute, and wherein said third operational parameter differs from said first operational parameter and said second operational parameter;

analyzing, by said processor, said first operational attribute, said second operational attribute, and said third operational attribute via usage of a streaming video analysis comprising deep packet inspection;

generating, by said processor based on results of said analyzing, a combination reference model based on said first reference model, said second reference model, and said third reference model;

generating, by said processor based on said combination reference model, a predicted future state and associated operational attributes for said hardware system;

determining, by said processor based on said acoustical parameter, said first fuel flow pattern, said unchanged travel velocity of said vehicle, said tailwind information for said current vehicular location, said adjusted engine RPM level and fuel consumption levels for said vehicle, and said combination reference model, that said vehicular hardware control device is powering down;

continuously and autonomously operating and adapting without any human supervision or intervention, by said processor based on said predicted future state, said combination reference model; and determining, by said processor based on said predicted future state and results of said determining that said vehicular hardware control device is powering down, repair options associated with electro/mechanical components of said hardware system.

14. A sensor based predictive method comprising:

initializing, by a first processing circuit internal to a first integrated circuit, a first sensor internal to said first integrated circuit, wherein said first integrated circuit is deployed with respect to an edge platform;

measuring, by said first sensor, a first operational parameter of a vehicular hardware control device of a vehicle of a hardware system, wherein said vehicle comprises a flight based vehicle, wherein said first operational parameter comprises a first fuel flow pattern associated with a fuel flowing to said vehicular hardware control device;

generating based on said first operational parameter, by said first processing circuit, a first reference model associated with a first operational attribute of said hardware system; and transmitting, by said first integrated circuit to a processor of a hardware device, said first reference model, wherein a second reference model associated with a second operational attribute of said hardware system is received by said processor from a second integrated circuit, wherein said second integrated circuit internally comprises a second processing circuit and a second sensor, wherein said second integrated circuit is deployed with respect to said edge platform, wherein said second sensor comprises a microphone, wherein said second sensor measures a second operational parameter of said vehicular hardware control device, wherein said second processing circuit generates said second reference model based on said second operational parameter, wherein said second operational attribute differs from said first operational attribute, wherein said second operational parameter differs from said first operational parameter, wherein said second operational parameter comprises an acoustical parameter associated with operational acoustics of said vehicular hardware control device, wherein a third reference model associated with a third operational attribute of said hardware system is received by said processor from a third integrated circuit, wherein said third integrated circuit internally comprises a third processing circuit and a third sensor embedded within said third integrated circuit, wherein said third integrated circuit is deployed with respect to said edge platform, wherein said third sensor comprises a GPS sensor linked to a weather related map associated with a preplanned flight route of said vehicle, wherein said third sensor measures a third operational parameter of said vehicular hardware control device, wherein measuring said third operational parameter comprises measuring an unchanged travel velocity of said vehicle and tailwind information for a current vehicular location and measuring an adjusted engine RPM level and fuel consumption levels for said vehicle, wherein said third processing circuit generates said third reference model based on said third operational parameter, wherein said third operational attribute differs from said first operational attribute and said second operational attribute, and wherein said third operational parameter differs from said first operational parameter and said second operational parameter, wherein said first operational attribute, said second operational attribute, and said third operational attribute are analyzed via usage of a streaming video analysis comprising deep packet inspection, wherein a combination reference model is generated by said processor based on said first reference model, said second reference model, and said third reference model, wherein a predicted future state and associated operational attributes are generated for said hardware system based on said combination reference model, wherein it is determined based on said acoustical parameter, said first fuel flow pattern, said unchanged travel velocity of said vehicle, said tailwind information for said current vehicular location, said adjusted engine RPM level and fuel consumption levels for said vehicle, and said combination reference model, that said vehicular hardware control device is powering down, wherein said combination reference model is continuously and autonomously operated and adapted without any human supervision or intervention based on said predicted future state, and wherein repair options associated with electro/mechanical components of said hardware system are determined based on said predicted future state and results of determining that said vehicular hardware control device is powering down.

15. The method of claim 14, wherein said first integrated circuit, said second integrated circuit, and said hardware device are comprised by said hardware system.

16. The method of claim 15, wherein said first processing circuit generates said first reference model via execution of a first executable algorithm, and wherein said second processing circuit generates said second reference model via execution of a second executable algorithm.

17. The method of claim 16, wherein said first executable algorithm differs from said second executable algorithm.

18. The method of claim 16, wherein said first executable algorithm comprises a same algorithm as said second executable algorithm.

19. The method of claim 14, wherein said first integrated circuit is communicatively connected to said second integrated circuit.

20. The method of claim 14, wherein said first processing circuit is integrated with said first sensor.

21. The method of claim 14, wherein said first sensor and said second sensor each comprise a sensor selected from the group consisting of a GPS sensor, an RFID sensor, a temperature sensor, an infrared sensor, a video retrieval device, a pressure sensor, and a flow sensor.

22. A computer program product, comprising a computer readable hardware storage device storing a computer readable program code, said computer readable program code comprising an algorithm that when executed by a first processing circuit internal to a first integrated circuit implements sensor based predictive method, said method comprising:
  initializing, by said first processing circuit, a first sensor internal to said first integrated circuit, wherein said first integrated circuit is deployed with respect to an edge platform;
  measuring, by said first sensor, a first operational parameter of a vehicular hardware control device of a vehicle of a hardware system, wherein said vehicle comprises a flight based vehicle, wherein said first operational parameter comprises a first fuel flow pattern associated with a fuel flowing to said vehicular hardware control device;
  generating based on said first operational parameter, by said first processing circuit, a first reference model associated with a first operational attribute of said hardware system; and
  transmitting, by said first integrated circuit to a processor of a hardware device, said first reference model, wherein a second reference model associated with a second operational attribute of said hardware system is received by said processor from a second integrated circuit, wherein said second integrated circuit internally comprises a second processing circuit and a second sensor, wherein said second integrated circuit is deployed with respect to said edge platform, wherein said second sensor comprises a microphone, wherein said second sensor measures a second operational parameter of said vehicular hardware control device, wherein said second processing circuit generates said second reference model based on said second operational parameter, wherein said second operational attribute differs from said first operational attribute, wherein said second operational parameter differs from said first operational parameter, wherein said second operational parameter comprises an acoustical parameter associated with operational acoustics of said vehicular hardware control device, wherein a third reference model associated with a third operational attribute of said hardware system is received by said processor from a third integrated circuit, wherein said third integrated circuit internally comprises a third processing circuit and a third sensor embedded within said third integrated circuit, wherein said third integrated circuit is deployed with respect to said edge platform, wherein said third sensor comprises a GPS sensor linked to a weather related map associated with a preplanned flight route of said vehicle, wherein said third sensor measures a third operational parameter of said vehicular hardware control device, wherein measuring said third operational parameter comprises measuring an unchanged travel velocity of said vehicle and tailwind information for a current vehicular location and measuring an adjusted engine RPM level and fuel consumption levels for said vehicle, wherein said third processing circuit generates said third reference model based on said third operational parameter, wherein said third operational attribute differs from said first operational attribute and said second operational attribute, and wherein said third operational parameter differs from said first operational parameter and said second operational parameter, wherein said first operational attribute, said second operational attribute, and said third operational attribute are analyzed via usage of a streaming video analysis comprising deep packet inspection, wherein a combination reference model is generated by said processor based on said first reference model, said second reference model, and said third reference model, wherein a predicted future state and associated operational attributes are generated for said hardware system based on said combination reference model, wherein it is determined based on said acoustical parameter, said first fuel flow pattern, said unchanged travel velocity of said vehicle, said tailwind information for said current vehicular location, said adjusted engine RPM level and fuel consumption levels for said vehicle, and said combination reference model, that said vehicular hardware control device is powering down, wherein said combination reference model is continuously and autonomously operated and adapted without any human supervision or intervention based on said predicted future state, and wherein repair options associated with electro/mechanical components of said hardware system are determined based on said predicted future state and results of determining that said vehicular hardware control device is powering down.

23. The method of claim 1, wherein said first operational parameter comprises a flight path of a vehicle comprising said hardware system, and wherein said second operational parameter comprises GPS coordinates of a location adjacent to said vehicle.

24. The method of claim 1 further comprising:
  receiving, by said processor from a third integrated circuit, a third reference model associated with a third operational attribute of a hardware system, wherein said third integrated circuit internally comprises a third processing circuit and a third sensor, wherein said third sensor measures a third operational parameter of said vehicular hardware control device, wherein said third operational parameter comprises a travel velocity associated with said vehicular hardware control device, and wherein said third processing circuit generates said third reference model based on said third operational parameter, wherein said generating said combination reference model is further based on said third reference model.

\* \* \* \* \*